United States Patent
Doi

(10) Patent No.: US 6,727,711 B2
(45) Date of Patent: Apr. 27, 2004

(54) FIXTURE-LESS BARE BOARD TESTER

(75) Inventor: Yutaka Doi, Minnetonka, MN (US)

(73) Assignee: Honeywell Advanced Circuits, Inc., Morristown, NJ (US)

(*) Notice: Subject to any disclaimer, the term of this patent is extended or adjusted under 35 U.S.C. 154(b) by 0 days.

(21) Appl. No.: 10/180,788

(22) Filed: Jun. 25, 2002

(65) Prior Publication Data

US 2002/0167330 A1 Nov. 14, 2002

Related U.S. Application Data

(62) Division of application No. 09/611,082, filed on Jul. 6, 2000, now Pat. No. 6,590,398.

(51) Int. Cl.[7] .............................................. G01R 31/302
(52) U.S. Cl. ........................................ 324/750; 324/501
(58) Field of Search ................................ 324/754, 750, 324/752, 753, 501, 678

(56) References Cited

U.S. PATENT DOCUMENTS

| | | | | | |
|---|---|---|---|---|---|
| 1,035,204 | A | * | 8/1912 | Leich et al. | 324/678 |
| 4,573,008 | A | * | 2/1986 | Lischke | 324/754 |
| 4,843,329 | A | | 6/1989 | Beha et al. | 324/561 |
| 5,357,191 | A | * | 10/1994 | Grace | 324/501 |
| 5,357,194 | A | | 10/1994 | Ullman et al. | 324/754 |
| 5,680,056 | A | * | 10/1997 | Ito et al. | 324/750 |

* cited by examiner

*Primary Examiner*—Ernest Karlsen
(74) *Attorney, Agent, or Firm*—Bingham McCutchen LLP; Sandra Thompson

(57) ABSTRACT

Methods and devices for testing connectivity between connectors on a circuit board include utilizing a bias board having a photoconductive layer coated with a light-transmissive electrically conductive layer in conjunction with a light source and a voltage source to alternately charge and discharge conductors. A conductor discharged by connecting it to a ground via the bias board is determined to be electrically connected to a previously charged conductor if current flows between the conductor and the ground.

5 Claims, 4 Drawing Sheets

1
providing a circuit board to be tested, the circuit board having a first conductive element and a second conductive element

2
establishing a voltage difference between the first conductive element and a reference node by coupling the first conductive element to a voltage source

3
decoupling the first conductive element from the voltage source

4
electrically coupling an ammeter between the second conductive element and the reference node

5
utilizing the ammeter to determine if a current flows between the second conductive surface and the reference node

Figure 1

FIXTURE-LESS BARE BOARD TESTER

This application is a divisional of application Ser. No. 09/611,082 filed Jul. 6, 2000, now U.S. Pat. No. 6,590,398.

FIELD OF THE INVENTION

The field of the invention is circuit test systems.

BACKGROUND OF THE INVENTION

As the spacing/pitch between connection pads on circuit boards decreases, previously utilized testing mechanisms such as the "bed of nails" text fixture used for the electrical test of bare circuit boards become inadequate. This inadequacy typically results, at least in part, from high cost, long delivery time, and/or insufficient density.

Although alternative testing mechanisms have been proposed, they too are at times inadequate or undesirable for testing high density/small pitch circuit boards. One such method is described in U.S. Pat. No. 4,843, 329 issued on Jun. 27, 1989 to Beha et al. (hereinafter "Beha"). Beha discusses a method for use in detecting whether two pads are electrically coupled (i.e. whether they are shorted together) by using an optical beam to generate a charge on a first pad (and any other pad connected to it), irradiating the board with an optical beam to cause an electron flux to be emitted from the second pad and a third pad, and detecting and comparing the flux from the second and third pads to determine if the second pad is electrically coupled to the first pad. This method is at times undesirable due to the need to cause photoemission of electrons and the need for testing within a vacuum chamber.

Another method is described in U.S. Pat. No. 5,357,194 issued on Oct. 18, 1994 to Ullman et al. (hereinafter "Ullman"). Ullman discusses using a series of contacts/probes coupled to a grid of light-transmissive electrically-conductive strips interconnected via photoconductive gates wherein a light source is utilized to selectively illuminate the gates to provide power to selected connectors. In essence, Ullman simply provides a test device comprising a grid of contacts/probes and a mechanisms for quickly selecting individual probes. As with the previous "bed of nails" approach, the Ullman method can become problematic when testing high density circuit boards or boards on which the pads to not line up well with the probes. Although customized versions could be produced to match up with specific circuit geometries, use of such customized versions increases the cost and introduces a period of delay before the device is ready for use in testing a particular board.

Thus, there is a continuing need for new methods and devices for circuit board testing, particularly in regard to devices and methods suitable for low cost and timely testing of high density circuit boards.

SUMMARY OF THE INVENTION

The present invention is directed to methods and apparatus for fixture-less testing of circuits. More specifically, connectivity between any two conductive points on a circuit board is tested by coupling one conductive point to a voltage source to charge the conductor, de-coupling the voltage source, and coupling the second conductive point to a ground and measuring any current flow between the second conductive point and the ground to determine if the second point was charged via a connection to the first conductive point. The use of light activated bias boards comprising a photoconductive layer coated with a light-transmissive electrically-conductive layer may be advantageously used in coupling the conductors to the voltage source and ground.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is a diagram of a first method embodying the invention.

DETAILED DESCRIPTION

Figure 2:
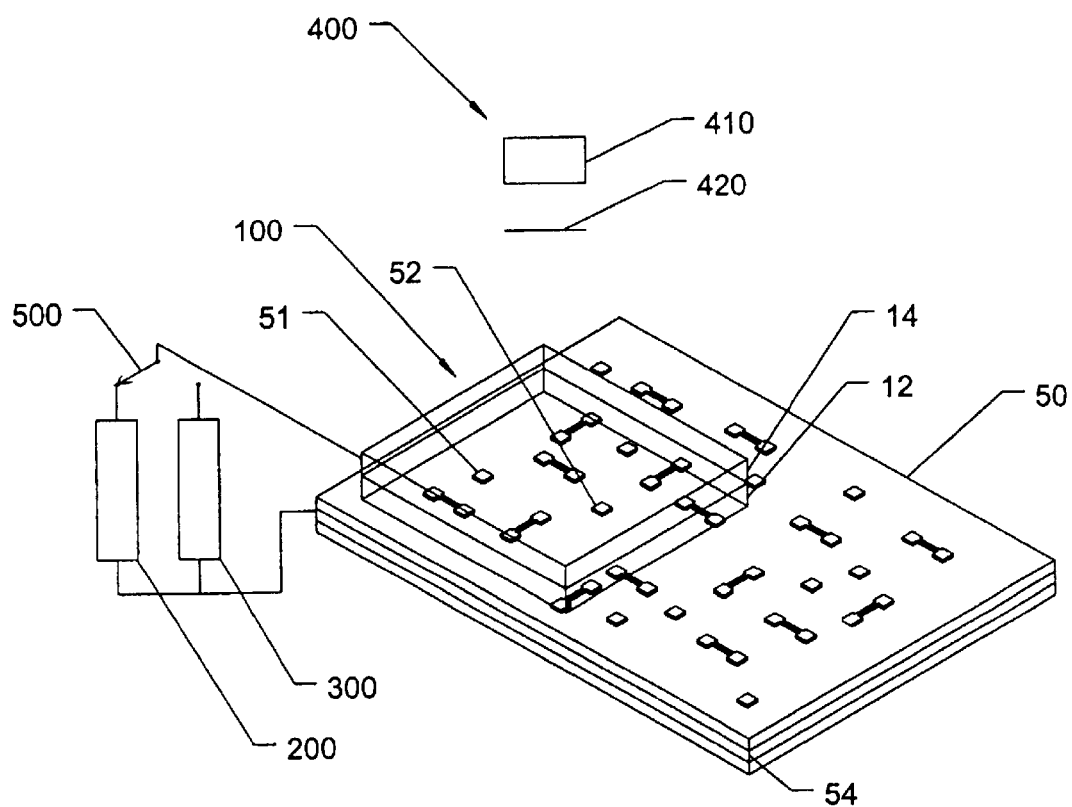
FIG. 2 is a symbolic perspective view of a first apparatus embodying the invention.
Figure 3:
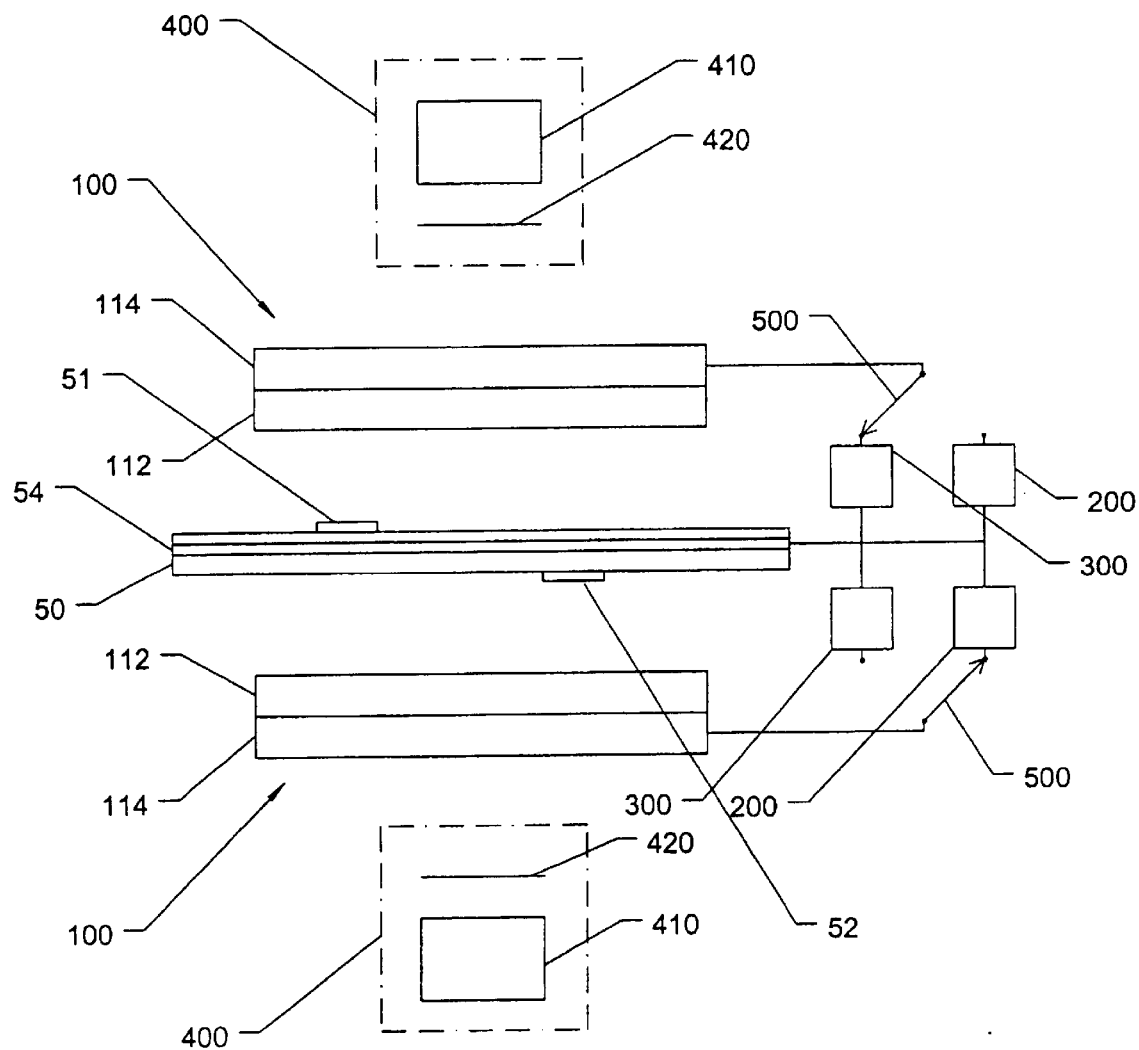
FIG. 3 is a symbolic side view of a second apparatus embodying the invention.
Figure 4:
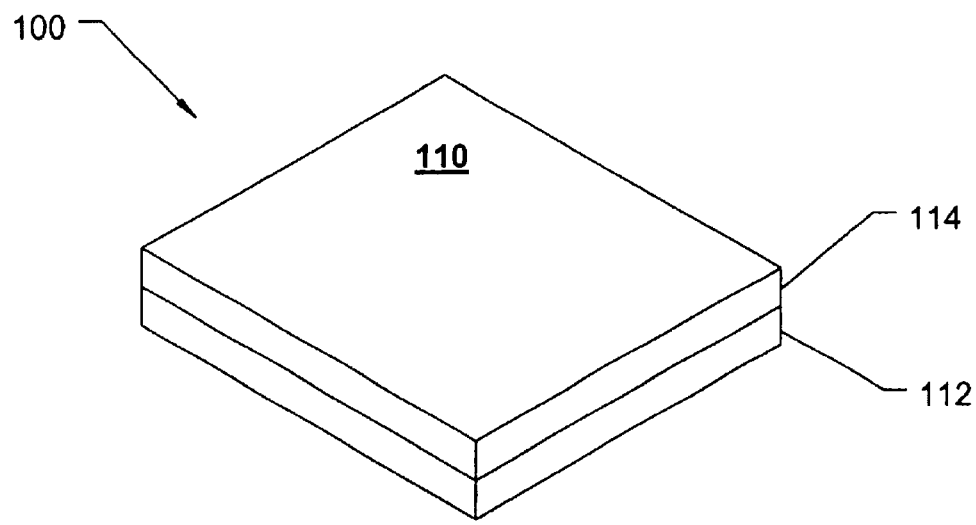
FIG. 4 is a perspective view of an embodiment of a bias board.
Figure 5:
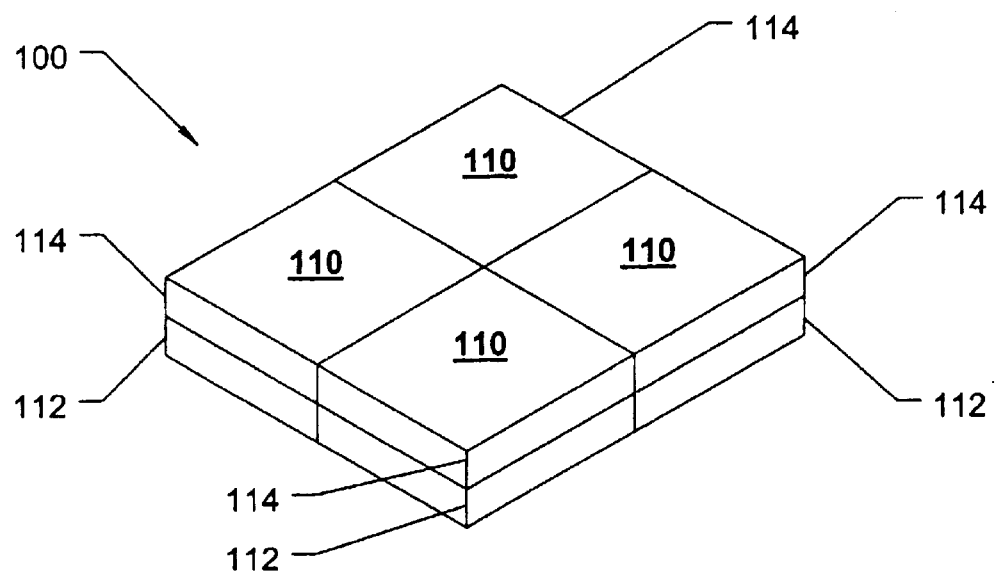
FIG. 5 is a perspective view of an alternative embodiment of a bias board.

Referring to FIGS. 1–5, a method for testing a circuit board comprises: step 1, providing a circuit board 50 to be tested, the circuit board having a first conductive element 51 and a second conductive element 52; step 2, establishing a voltage difference between the first conductive element 51 and a reference node 54 by coupling the first conductive element to a voltage source 200; step 3, decoupling the first conductive element 51 from the voltage source 200; step 4, electrically coupling an ammeter 300 between the second conductive element 52 and the reference node 54; step 5, utilizing the ammeter 300 to determine if a current flows between the second conductive element 52 and the reference node 54. If a current flows, the two conductive elements are electrically connected. If current doesn't flow, the two conductive elements are not electrically connected.

Typically, the circuit board 50 to be tested will comprise patterned conductive layers on opposite sides of the circuit board, the patterned layers including conductive elements such as pads and traces, and in particular, conductive elements 51 and 52. In preferred applications, reference node 54 will comprise a grounded conductive element such as a pad or trace electrically coupled to a ground plane of the circuit board 50. As used herein, the phrase "circuit board" is intended to broadly cover any device comprising at least two electrically connected conductive elements and thus includes but is not necessarily limited to printed circuit boards, printed wiring boards, single and multi-layer interconnects, and packaged and unpackaged integrated circuits. However, the methods and devices disclosed herein are contemplated as being particularly beneficial when the conductive elements to be tested are located on one or more substantially planar surfaces.

The disclosed method may be advantageously employed in conjunction with a test system designed to implement the disclosed method. A preferred such system comprises: a light source 400; a voltage source 200, an ammeter 300, and a bias board 100 comprising at least one bias member 110 having a photoconductive layer 112 coated with a transparent or translucent conductive layer 114, wherein each bias member 110 is electrically coupled to every other bias member 110 such that a voltage established on the photoconductive layer 112 of one bias member results in an approximately equivalent voltage being established on the photoconductive layer 112 of every other bias member 110.

In a preferred test system, bias board 100 comprises a single bias member 110 which in turn comprises a single photoconductive layer 112 coated with a single light-transmissive electrically-conductive layer 114. It is contemplated that the use of photoconductive layer 112 having one surface completely coated with a light-transmissive electrically-conductive layer 114 provides the greatest flexibility in applying the test system to boards of varying geometries. With such a bias board, a voltage applied to the conductive layer 114 can be applied to any conductor in contact with the photoconductive layer 112 by illuminating a point on the photoconductive layer adjacent to the conductor. As there are no gaps in either the conductive layer 114 or the photoconductive layer 112, and as there are no non-light-transmissive conductors obscuring any part of the bias board, there is no need to reconfigure the bias board or carefully align it to match up with the geometry of the board to be tested. In less preferred embodiments, bias board 100 may comprise a plurality of bias members 110. A bias board 100 having a plurality of bias member 110 pushed up against each other so as to minimize or eliminate any gaps between the bias members would generally be almost as flexible as a board comprising a single bias member and may actually be more flexible in regard to testing circuit boards which are larger than the size of a single bias member if the maximum size of such a member is smaller than the size of the board to be tested. Bias boards 100 having bias members separated by a distance D are contemplated as being less desirable than a board having a single member is adequate where such an arrangement still permits contact with the conductors to be tested. Photoconductive layers 112 may typically be characterized as having a coated side 112a and a circuit contacting side 112b. For the preferred embodiment utilizing a single bias member 110 the photoconductive layer 112 will have an area greater than equal to the area of the circuit board to be tested. Whether single or multiple bias members 110 are used in bias board 100, it is contemplated that photoconductive layers 112 may advantageously comprise circuit contacting surfaces which have an area greater or equal to A square inches wherein A is one of 0.5, 1, 2, 4, 9, 16, or 25. It is also contemplated that when testing circuit boards comprising a plurality of contact pads, the circuit contacting surface will advantageously have a minimum width of at least X times the maximum pitch between contact pads where X is one of 1, 2, 5, or 10.

Although transparent or translucent layer 114 may comprise any light transmissive material or combination of materials it is contemplated that layers comprising tin oxide or indium oxide may be advantageously used. Similarly, although any photoconductive material or combination of materials may be used for photoconductive layer 112, it is contemplated that layers comprising cadmium sulfide or zinc sulfide may be advantageously used.

It is contemplated that voltage source 200 and ammeter 300 may be coupled to the light-transmissive conductive layer via one or more switches 500 such that while the voltage source is electrically connected to the conductive layer the ammeter is not and that the voltage source is not electrically connected to the conductive layer while the ammeter is electrically coupled to the conductive layer.

For circuit boards having conductive element on opposing sides, a system comprising a second bias board and a second light source is preferred. In such a system the two bias boards are positioned between the two light sources, and the transparent or translucent conductive layer of the second bias board is positioned between the second light source and the photoconductive layer of the second bias board. When arranged in this fashion, a circuit board can be positioned between the two bias boards such that the circuit contacting surfaces of the bias members may be placed in contact with elements 51 and 52 of circuit board 50. An alternative, less desirable approach to dealing with conductive elements on opposite sides of a circuit board is to flip the circuit board over after the first conductor has been charged so that a single bias board can be used to both charge and discharge conductors located on opposite sides of the circuit board.

Any light source capable of providing a light which can be focused and positioned to illuminate small enough points on the photoconductive layer may be utilized. However, it is contemplated that typical embodiments will comprise a light bulb or laser 410 and a focusing optic 420 such as a lens. Alternative embodiments may utilize differing numbers or arrangements of lights and optical elements for positioning and directing the light provided. As an example, a system utilizing a single light source 400 but two bias boards 100 can be used to illuminate both boards through the proper direction of the generated light. Alternatively, multiple light sources may be used for one or more bias boards.

When the disclosed methods and apparatus are combined, the step of coupling the first conductive element to the voltage source involves placing it in contact with a photoconductive layer of a bias element which is electrically coupled to the voltage source via the electrically-conductive light-transmissive layer, and shining a light on the photoconductive layer at a point adjacent to the first conductive element. Similarly, the step of coupling the second conductive element to the ammeter involves placing it in contact with a photoconductive layer electrically coupled to the ammeter via the electrically conductive light transmissive layer, and shining a light on the photoconductive layer at a point adjacent to the second conductive element. Such a method may be described as including the following steps: providing a circuit board to be tested; providing a first bias board and placing the first bias board in contact with a first surface of the circuit board; providing a second bias board and placing the second bias board in contact with a second surface of the circuit board wherein the second surface is opposite the first surface; coupling the first bias board to a voltage source and causing light from a light source to contact the first bias board adjacent to a first conductor of the circuit board; preventing light from the light source from contacting the first bias board; coupling the second bias board to a ground via an ammeter and causing light from a light source to contact the second bias board adjacent to a second conductor of the circuit board.

Causing the light from the light source(s) to contact the photoconductive layer of the bias board may be accomplished in a number of ways, including but not necessarily limited to stepping or moving the circuit board under test with respect to the light source and/or scanning the circuit board under test by deflecting the light source.

From the foregoing it can be seen that the disclosed devices and methods provide numerous advantages over the prior art. One such advantage is that no modification of the test system is necessary to handle testing of circuit boards having different configurations. Another is that eliminating the need for mechanical movement and alignment of a probe results in a significant time savings. Yet another is that potentially damaging contact between a probe and conductive elements is eliminated. Still another is that testing can be performed at room temperature and pressure. Although other advantages exist, any one of the listed advantages by itself makes for a testing system which permits lower cost and more timely testing of high density circuit boards.

Thus, specific embodiments and applications of devices and methods for testing circuit boards have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A test system for testing a circuit board having a first conductive element and a second conductive element, the system comprising:

a light source;

a bias board comprising at least one bias member having a photoconductive layer coated with a transparent or translucent conductive layer, wherein each bias member is electrically coupled to every other bias member such that a voltage established on the photoconductive layer of one bias member results in an approximately equivalent voltage being established on the photoconductive layer of every other element.

2. The test system of claim 1 further comprising:

a voltage source;

an ammeter that electrically couples the second conductive element and a reference node; and at least one switch intermittently electrically coupling the voltage source and ammeter to the bias board.

3. The test system of claim 2 wherein the bias board comprises a single bias member.

4. The test system of claim 3 wherein the circuit to be tested comprises a plurality of contact pads having a maximum pitch between contact pads, and wherein the bias member comprises a first surface coated with the transparent or translucent conductive layer and a second, circuit contacting surface opposite the first surface, wherein the circuit contacting surface has a minimum width of at least X times the maximum pitch between contact pads where X is one of 1, 2, 5, or 10.

5. The test system of claim 4 wherein the circuit contacting surface has an area greater or equal to A square inches wherein A is one of 0.5, 1, 2, 4, 9, 16, or 25.

* * * * *

UNITED STATES PATENT AND TRADEMARK OFFICE
CERTIFICATE OF CORRECTION

PATENT NO.     : 6,727,711 B2
DATED          : April 27, 2004
INVENTOR(S)    : Yutaka Doi It is certified that error appears in the above-identified patent and that said Letters Patent is hereby corrected as shown below:

Column 3,
Line 31, insert a paragraph after "tested." and before "Photoconductive"

Signed and Sealed this

Eighth Day of February, 2005

JON W. DUDAS
*Director of the United States Patent and Trademark Office*